US012690427B2

(12) United States Patent
Son et al.

(10) Patent No.: US 12,690,427 B2
(45) Date of Patent: Jul. 21, 2026

(54) SENSOR STATION, DATA ACQUISITION METHOD AND SUBSTRATE TREATING SYSTEM

(71) Applicant: SEMES CO., LTD., Cheonan-si (KR)

(72) Inventors: Sang Hyun Son, Busan (KR); Yong-Jun Seo, Hwaseong-si (KR); Su Jin Chae, Suwon-si (KR); Dong Ok Ahn, Anyang-si (KR); Jae Hong Kim, Asan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 965 days.

(21) Appl. No.: 17/956,901

(22) Filed: Sep. 30, 2022

(65) Prior Publication Data

US 2023/0100373 A1     Mar. 30, 2023

(30) Foreign Application Priority Data

Sep. 30, 2021     (KR) ........................ 10-2021-0129407

(51) Int. Cl.
| | |
|---|---|
| *H10P 74/00* | (2026.01) |
| *H10P 72/00* | (2026.01) |
| *H10P 72/30* | (2026.01) |
| *H10P 72/76* | (2026.01) |

(52) U.S. Cl.
CPC ........ *H10P 74/277* (2026.01); *H10P 72/0612* (2026.01); *H10P 72/3302* (2026.01); *H10P 72/7602* (2026.01)

(58) Field of Classification Search
USPC .......................... 320/106, 107, 108, 109, 110
See application file for complete search history.

(56) References Cited

U.S. PATENT DOCUMENTS

| | | | |
|---|---|---|---|
| 7,531,984 B2 | 5/2009 | Freed et al. | |
| 7,778,793 B2 | 8/2010 | Bonciolini et al. | |
| 11,544,608 B2 * | 1/2023 | Florence | .............. H05B 47/115 |
| 2005/0274645 A1 * | 12/2005 | Hasegawa | ......... H01L 21/67383 |
| | | | 257/E21.001 |
| 2006/0181242 A1 * | 8/2006 | Freed | ..................... H02J 50/12 |
| | | | 320/109 |
| 2022/0390949 A1 * | 12/2022 | Shimada | ................ G06V 20/64 |

FOREIGN PATENT DOCUMENTS

| | | | | |
|---|---|---|---|---|
| CN | 101262404 | A | * | 9/2008 |
| JP | 5019712 | B2 | | 9/2012 |
| KR | 102137850 | B1 | | 7/2020 |
| WO | 2004/051713 | A2 | | 6/2004 |

OTHER PUBLICATIONS

Korean Office Action dated Feb. 20, 2025 issued in corresponding Korean Patent Appln. No. 10-2021-0129407.

* cited by examiner

*Primary Examiner* — Brian Ngo
(74) *Attorney, Agent, or Firm* — Harness, Dickey & Pierce, P.L.C.

(57) ABSTRACT

The inventive concept provides a sensor station. The sensor station includes a body providing an inner space for storing a substrate-type sensor; a power source unit installed at the body and configured to transmit a power to the substrate-type sensor; a processing unit installed at the body and configured to process a data measured by the substrate-type sensor; and a communication unit installed at the body and configured to exchange a data with the substrate-type sensor and a server of a substrate treating system.

12 Claims, 8 Drawing Sheets

410: 412,414,416,418

SENSOR STATION, DATA ACQUISITION METHOD AND SUBSTRATE TREATING SYSTEM

CROSS-REFERENCE TO RELATED APPLICATIONS

A claim for priority under 35 U.S.C. § 119 is made to Korean Patent Application No. 10-2021-0129407 filed on Sep. 30, 2021, in the Korean Intellectual Property Office, the entire contents of which are hereby incorporated by reference.

BACKGROUND

Embodiments of the inventive concept described herein relate to a sensor station, a data acquisition method, and a substrate treating system.

In order to manufacture a semiconductor element, various processes are performed on a substrate such as a wafer. For example, in order to manufacture the semiconductor element, various processes such as a photolithography process, an etching process, a deposition process and an ion implantation process, and a metal wiring process are performed on the substrate such as the wafer.

Recently, as a critical dimension (CD) of a pattern formed on a substrate is becoming finer, a precise control is required for the above-described process. Accordingly, a sensor wafer with the same/similar shape as a substrate to be treated is taken into a process chamber and a process data of the process chamber sensed by the sensor wafer (e.g., a temperature profile of a temperature change of the substrate, a profile of a pressure applied to the substrate, or a data of a voltage/current applied to the substrate) are changed.

FIG. 1 is a flowchart illustrating a general data acquisition method of a sensor wafer. Referring to FIG. 1, in a general data acquisition method of a sensor wafer, the sensor wafer is first loaded onto a container capable of storing the sensor wafer such as an FOUP S1. Thereafter, the FOUP loaded with the sensor wafer is loaded in a substrate treating apparatus S2. A transfer robot of the substrate treating apparatus takes out the sensor wafer from the FOUP and takes it into the process chamber in which a substrate treating process is performed. The sensor wafer taken into the process chamber measures a process data. The measured process data is stored in a memory of the sensor wafer. If a measurement of the process data is completed, the sensor wafer is returned from the process chamber to the FOUP again by the transfer robot of the substrate treating apparatus.

In order to acquire the process data stored in the sensor wafer, an operator takes out the sensor wafer from the FOUP and manually loads the sensor wafer which is taken out into a sensor wafer exclusive station S4. The sensor wafer exclusive station may be connected to a laptop through a USB port or the like. The operator acquires the process data by transmitting the process data stored in the sensor wafer to the laptop via the sensor wafer exclusive station S5. The operator manually inputs an acquired process data to the substrate treating apparatus or transmits a data file to the substrate treating apparatus S6. A process treating condition of the substrate treating apparatus may be changed by using the process data transmitted to the substrate treating apparatus. Thereafter, the operator picks up the exclusive station and moves to another substrate treating apparatus S7.

In this way, in order to acquire the process data stored on the sensor wafer in general, the operator must load the sensor wafer on the exclusive station and manually acquire the process data stored on the sensor wafer loaded on the exclusive station. Not only is this data acquisition method very cumbersome, but it can also cause a number of data security problems because it requires a laptop to acquire the data.

In addition, the process data acquired by the sensor wafer only exists in a state stored in the sensor wafer until the operator manually acquires it. In other words, the acquired process data cannot be immediately utilized. Accordingly, it is difficult to effectively perform an optimization operation such as changing a process treating condition of the substrate treating apparatus.

SUMMARY

Embodiments of the inventive concept provide a sensor station, a data acquisition method, and a substrate treating system for effectively acquiring a data acquired by a substrate-type sensor.

Embodiments of the inventive concept provide a sensor station, a data acquisition method, and a substrate treating system for transmitting a data acquired by the substrate-type sensor to the sensor station, or to a server of the substrate treating system in real time.

Embodiments of the inventive concept provide a sensor station, a data acquisition method, and a substrate treating system for transmitting a data acquired by the substrate-type sensor to a server of the substrate treating system in real time, even if a communication method of the server of the substrate treating system and the substrate-type sensor is different.

The technical objectives of the inventive concept are not limited to the above-mentioned ones, and the other unmentioned technical objects will become apparent to those skilled in the art from the following description.

The inventive concept provides a sensor station. The sensor station includes a body providing an inner space for storing a substrate-type sensor; a power source unit installed at the body and configured to transmit a power to the substrate-type sensor; a processing unit installed at the body and configured to process a data measured by the substrate-type sensor; and a communication unit installed at the body and configured to exchange a data with the substrate-type sensor and a server of a substrate treating system.

In an embodiment, the body includes: a housing having a shape with an open side; a door forming the inner space by coupling together with the body; and a flange installed at the housing and gripped by a gripper of a transfer device.

In an embodiment, the power source unit includes: a power receiving part configured to receive a power from an outer power source; a power storing part configured to store the power received at the power receiving part; and a power transferring part configured to transmit the power of the power storing part to the substrate-type sensor stored at the inner space.

In an embodiment, the communication unit includes: a first communication part configured to exchange a data with the substrate-type sensor; and a second communication part configured to exchange a data with the server of the substrate treating system.

In an embodiment, the communication unit further includes a communication conversion part configured to mediate a communication between heterogeneous networks.

In an embodiment, the processing unit includes: a data processing part configured to process a data transmitted by the substrate-type sensor; and a data storing part configured to store a post-treatment data treated by the data processing part and a pre-treatment data transmitting by the substrate-type sensor through the communication unit.

The inventive concept provides a data acquisition method for acquiring a data of a process chamber of a substrate treating apparatus. The method includes loading a sensor station storing a substrate-type sensor which acquires a process data and which is taken in to the process chamber onto a load port of the substrate treating apparatus; transferring the substrate-type sensor to by a transfer unit of the substrate treating apparatus and measuring a data within the process chamber by the substrate-type sensor; and wireless communicating by a sensor station placed on the substrate-type sensor and the load port.

In an embodiment, the wireless communicating is performed with a door of the sensor station placed on the load port in an open state.

In an embodiment, the wireless communicating further comprises transmitting a data transmitted to the sensor station to an outer server in a wireless communication method.

In an embodiment, the wireless communicating further comprises directly transmitting a data to the server by the transmission member of the substrate-type sensor through a medium of the communication unit of the sensor station.

In an embodiment, the wireless communicating further comprises transferring the data to the data storing part of the sensor station in the wireless communication method by the transfer member of the substrate-type sensor, and transferring the data stored at the data storing part to the server in the wireless communication method by the communication unit of the sensor station.

In an embodiment, the communication unit of the sensor station and the server exchanged a data in the wireless communication method, and the wireless communicating further includes: transferring the data to a data storing part of the sensor station by the transfer member of the substrate-type sensor, if a sensitivity of the communication unit and the server are below a set sensitivity or the same, and transferring the data to the server by the transfer member of the substrate-type sensor by medium of the communication unit, if the sensitivity of the communication unit and the server are larger the set sensitivity.

The inventive concept provides a substrate treating system. The substrate treating system includes a server; a substrate treating apparatus for treating a substrate, the substrate treating apparatus including a load port for placing a container storing the substrate, a process chamber configured to treat the substrate, and a transfer unit configured to transfer the substrate between the container and the process chamber; a substrate-type sensor for measuring a data at the process chamber, the substrate-type sensor including a body having a form which can be transferred to the process chamber by the transfer unit, a data measurement member installed at the body and configured to measure the data, and a transfer member and a power source member installed at the body and configured to transmit the data measured by the data measurement member; and a sensor station, and wherein the sensor station includes: a housing having a shape with an open surface; a door forming an inner space by coupling together with the housing; and a flange installed at the housing and gripped by a gripper of a transfer device.

In an embodiment, the sensor station further includes: a power source installed at the body and configured to transfer a power to the power source member; a processing unit installed at the body and configured to process the data measured at the data measurement member; and a communication unit installed at the body and configured to exchange a data with the substrate-type sensor and the server.

In an embodiment, the power source unit includes: a power receiving part configured to receive a power from an outer power source; a power storing part configured to store the power from received at the power receiving part; and a power transferring part configured to transfer the power of the power storing part to the substrate-type sensor stored at the inner space.

In an embodiment, the communication unit includes: a first communication part configured to exchange the data with the substrate-type sensor which acquires the data from the process chamber; and a second communication part configured to exchange the data with the server.

In an embodiment, the communication unit further comprises a communication conversion part configured to mediate a communication between heterogeneous networks.

In an embodiment, the substrate treating system further includes an opening/closing robot for opening or closing the door of the sensor station placed on the load port, and wherein the opening/closing robot opens the door of the sensor station placed on the load port while the data is measured at the process chamber by the substrate-type sensor.

In an embodiment, the processing unit includes: a data processing part configured to process the data transferred by the substrate-type sensor; and a data storing part configured to store a post-treatment data transferred by the data processing part, or the pre-treatment data transferred through the communication unit by the substrate-type sensor.

In an embodiment, the substrate treating system further includes a transfer device for transferring the sensor station and the container.

According to an embodiment of the inventive concept, a data acquired by a substrate-type sensor may be effectively acquired.

According to an embodiment of the inventive concept, a data acquired by a substrate-type sensor may be transmitted to a sensor station or a server of a substrate treating system in real time.

According to an embodiment of the inventive concept, a data acquired by a substrate-type sensor may be transmitted to a server of the substrate-type sensor in real time, even if a communication method of the server of the substrate treating system and the substrate-type sensor is different.

The technical objectives of the inventive concept are not limited to the above-mentioned ones, and the other unmentioned technical objects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
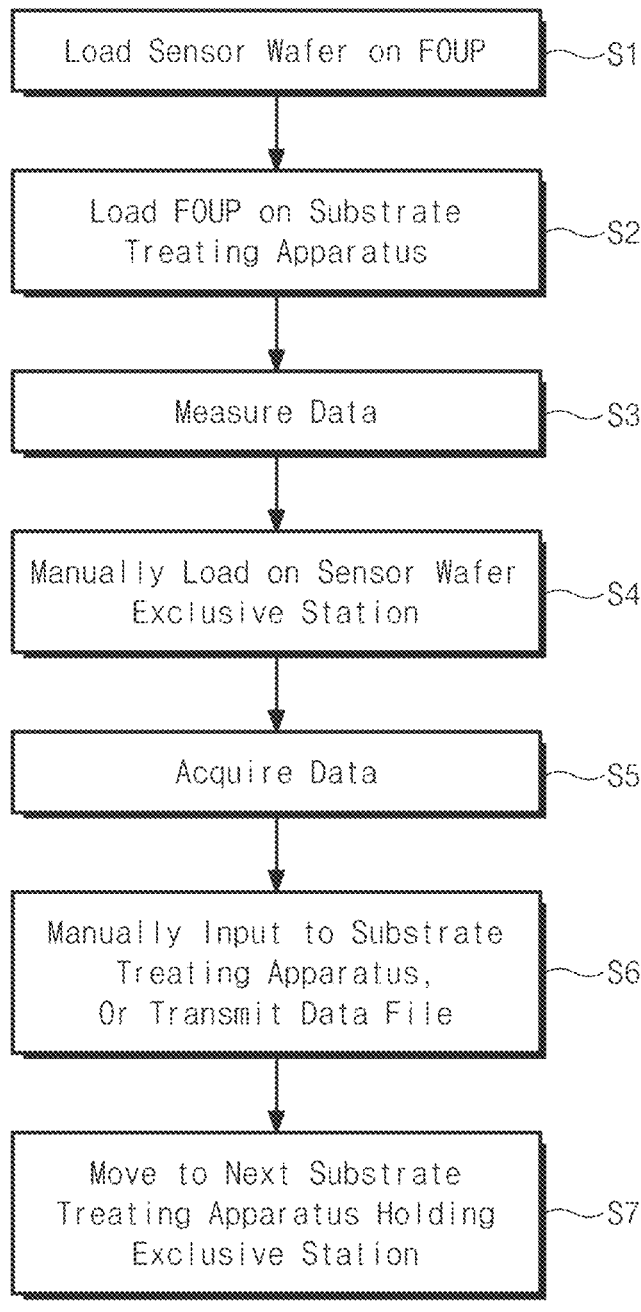
FIG. 1 is a flowchart illustrating a general data acquisition method of a sensor wafer.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

In an embodiment of the inventive concept, a substrate treating apparatus for etching a substrate using a plasma will be described. However, the inventive concept is not limited thereto, and may be applied to various types of apparatuses which perform a process by supplying the plasma into a chamber.

Hereinafter, an embodiment of the inventive concept will be described with reference to FIG. 2 to FIG. 9.

Figure 2:
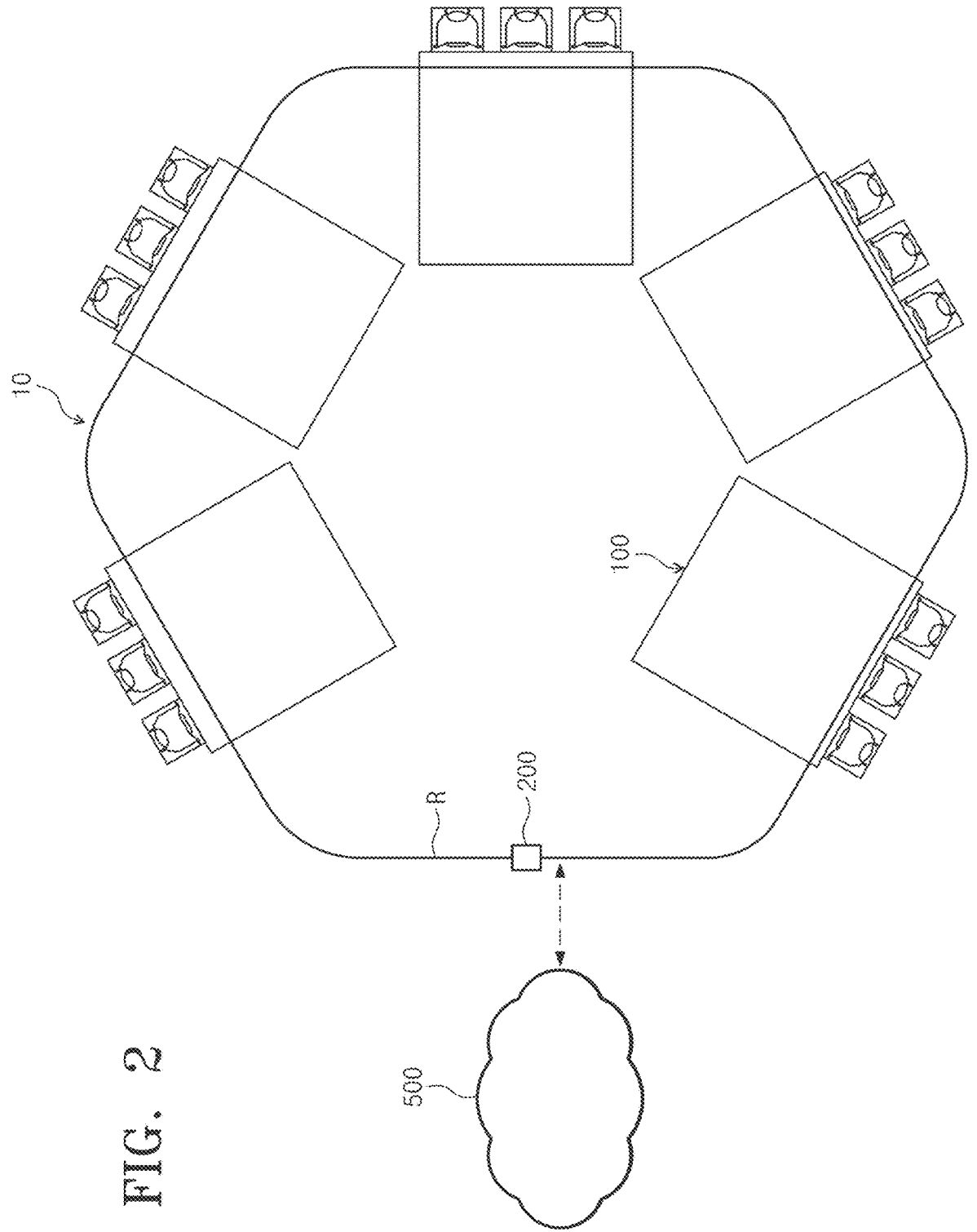
FIG. 2 illustrates a substrate treating system according to an embodiment of the inventive concept.

FIG. 2 illustrates a substrate treating system according to an embodiment of the inventive concept.

Referring to FIG. 2, a substrate treating system 10 according to an embodiment of the inventive concept may include a substrate treating apparatus 100, a transfer device 200, a substrate-type sensor 300, a sensor station 400, and a server 500.

The substrate treating apparatus 100 may perform a treating process on a substrate such as a wafer. The substrate treating apparatus 100 may perform a known substrate treating process such as a coating process, a cleaning process, or an etching process on the substrate. For example, the substrate treating apparatus 100 may perform the coating process for supplying a photoresist liquid to the substrate, the cleaning process for removing impurities remaining on the substrate, or the etching process for removing a thin film formed on the substrate.

Hereinafter, the substrate treating apparatus 100 is described as an apparatus which performs the etching process of removing the thin film on the substrate using the plasma as a example.

Figure 3:
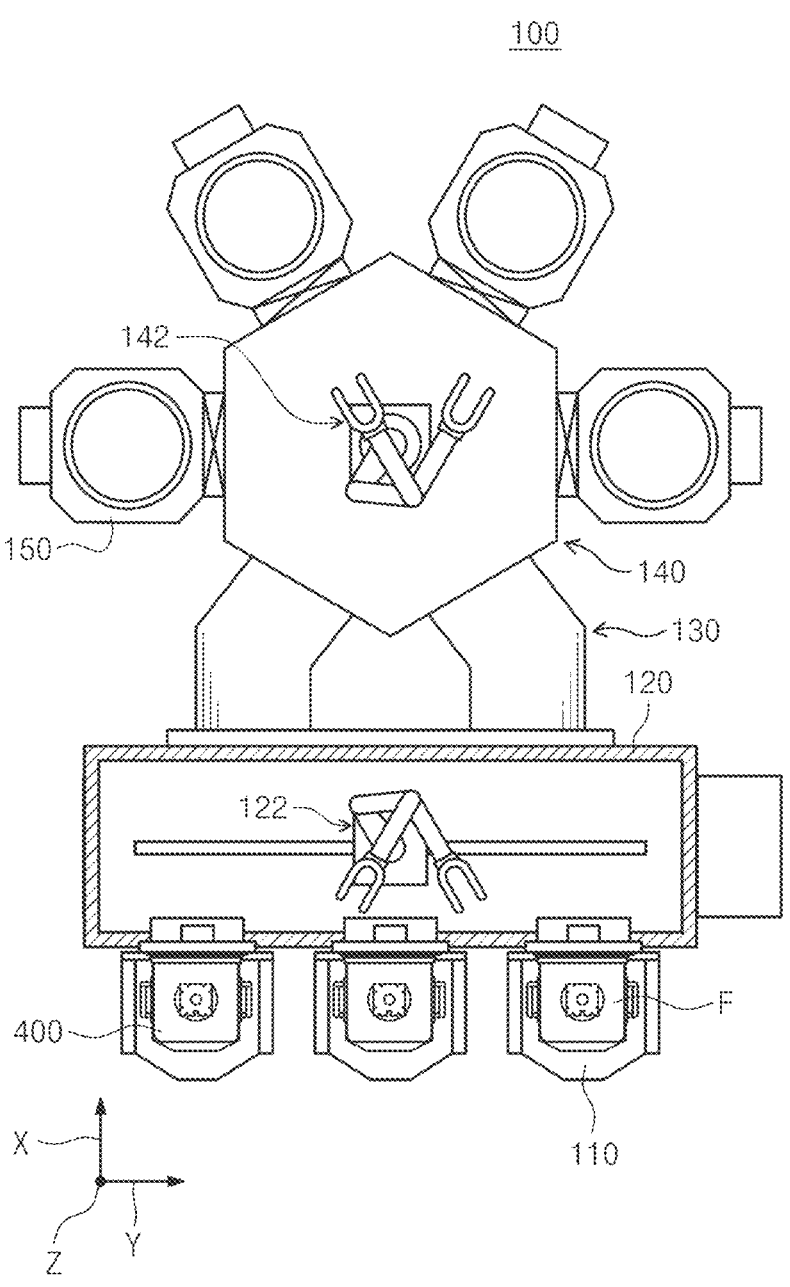
FIG. 3 schematically illustrates a substrate treating apparatus of FIG. 2.

FIG. 3 schematically illustrates the substrate treating apparatus of FIG. 2. Referring to FIG. 3, the substrate treating apparatus 100 according to an embodiment of the inventive concept may include a load port 110, an index chamber 120, a load lock chamber 130, a transfer chamber 140, and a process chamber 150.

A container F in which a substrate such as a wafer to be treated is stored may be placed in the load port 110. In addition, a sensor station 400 in which a substrate-type sensor 300 is stored may be placed in the load port 110. The container F and the sensor station 400 may have the same/or similar appearance to each other so as to be transferred by one transfer device 200.

The index chamber 120 may be maintained in an atmospheric pressure atmosphere. The index chamber may be disposed between the load lock chamber 130 and the load port 110 to be described later. An index robot 122 may be provided in the index chamber 120. The index robot 122 may be referred to as a transfer unit. The index robot 122 may take out the substrate or the substrate-type sensor 300 from the sensor station 400 or the container F to return to the load lock chamber 130.

In the load lock chamber 130, an inner atmosphere may be switched between the atmospheric pressure atmosphere and a vacuum pressure atmosphere. For example, if the inner atmosphere of the load lock chamber 130 is maintained in the atmospheric pressure atmosphere, the substrate or substrate-type sensor 300 may be taken in from the index chamber 120. If the substrate or the substrate-type sensor 300 is taken in, the inner atmosphere of the load lock chamber 130 may be changed from an atmospheric pressure atmosphere to a vacuum pressure atmosphere. Thereafter, the transfer robot 142 to be described later may take out the substrate W from the load lock chamber 130.

An inner atmosphere of the transfer chamber 140 may be maintained in the vacuum pressure atmosphere. A transfer robot 142 may be provided in the transfer chamber 140. The transfer robot 142 may take out the substrate or the substrate-type sensor 300 from the load lock chamber and return the substrate-type sensor 300 to the process chamber 150. The transfer robot 142 may be referred to as a transfer unit.

The process chamber 150 may treat the substrate. The process chamber 150 may process the substrate using a plasma. While the process chamber 150 treats the substrate, an inner space of the process chamber 150 may be sealed. While the process chamber 150 treats the substrate, an inner atmosphere of the process chamber 150 may be maintained in the vacuum pressure atmosphere.

Figure 4:
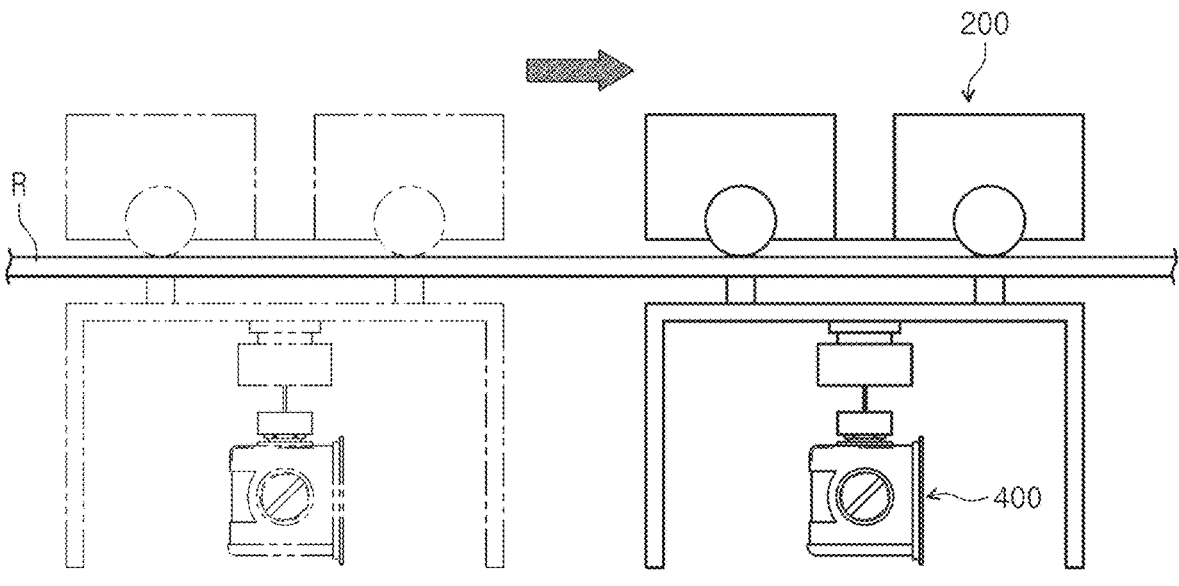
FIG. 4 schematically illustrates a transfer device of FIG. 2.

FIG. 4 schematically illustrates the transfer device of FIG. 2. Referring to FIG. 4, the transfer device 200 may travel along a rail R installed on a ceiling of a semiconductor manufacturing line. The transfer device 200 may be configured to transfer the container F in which the substrate is stored. In addition, the transfer device 200 may be configured to transfer the sensor station 400 in which the substrate-type sensor 300 is stored. For example, the transfer device 200 may have a gripper capable of gripping a flange 416 of the sensor station 400. In addition, the transfer device 200 may have a gripper capable of gripping the flange of the container F. The transfer device 200 may be an overhead transport apparatus OHT.

Figure 5:
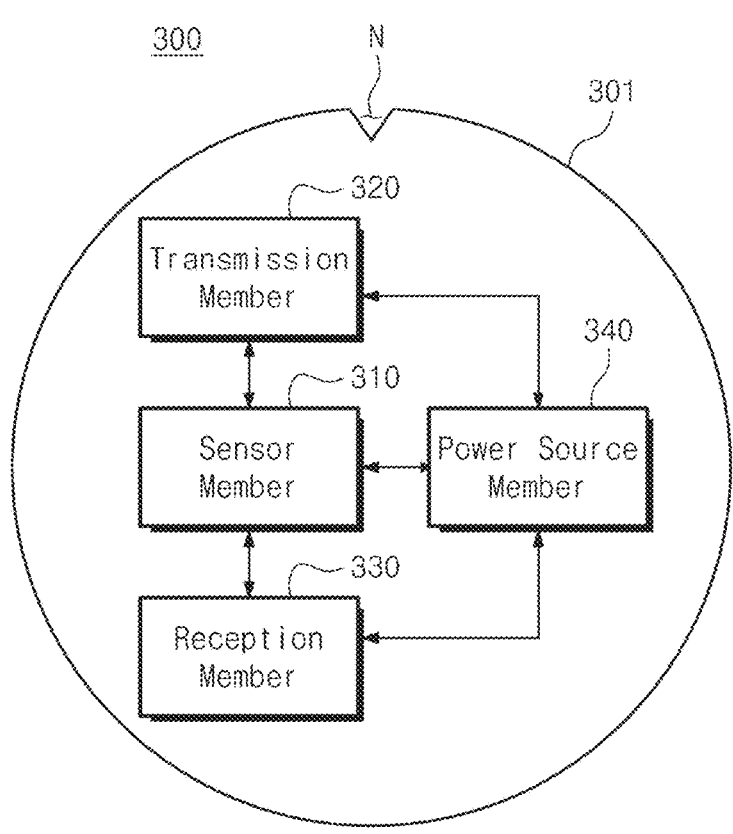
FIG. 5 schematically illustrates a substrate-type sensor which is taken into a process chamber of FIG. 3 to acquire a data.

FIG. 5 schematically illustrates a substrate-type sensor which is taken into the process chamber of FIG. 3 to acquire the data. Referring to FIG. 5, the substrate-type sensor 300 may have the same or similar shape as the substrate to be treated. The substrate-type sensor 300 may have an outer shape which the above-described transfer unit, for example, the index robot 122 or the transfer robot 142, may transfer. The substrate-type sensor 300 may have the same or a similar diameter as the substrate to be treated.

The substrate-type sensor 300 may include a body 301, a sensor member 310, a transmission member 320, a reception member 330, and a power source member 340.

The body 301 may have a plate shape. The body 301 may have the same or a similar shape as the substrate to be treated, for example, a wafer. The body 301 may have a shape in which the transfer unit may be transferred to the process chamber 150. The body 301 may have a thin disk shape. The sensor member 310, the transmission member 320, the reception member 330, and the power source member 340 may be installed on the body 301.

The sensor member 310 (a first exemplary data measurement member) may sense the process data. For example, the substrate-type sensor 300 may be taken into the process chamber 150. If the substrate-type sensor 300 is taken into the process chamber 150, the process chamber 150 may perform the same process as when the substrate to be treated is treated. In this case, the substrate-type sensor 300 may acquire the process data. The process data may be a temperature profile indicating a temperature change of the substrate-type sensor 300, a pressure profile indicating a pressure change which is transferred to the substrate-type sensor 300, a current flowing through the substrate-type sensor 300, or a power profile measuring a magnitude of an applied voltage. That is, the sensor member 310 may be any one of a pressure measurement sensor, a temperature measurement sensor, a voltage measurement sensor, or a current measurement sensor. A plurality of sensor members 310 may be installed.

The process data measured by the sensor member 310 may be transmitted to the transmission member 320. The transmission member 320 may be a communication device capable of exchanging the process data with the communication unit 430 of the sensor station 400 to be described later.

The reception member 330 may be a member 330 capable of receiving a condition value for acquiring the process data. For example, the reception member 330 may receive the condition value for acquiring the process data from the communication unit 430 of the sensor station 400 to be described later. For example, the sensor station 400 may transmit to the reception member 330 the condition value for a period in which the sensor member 310 senses the process data. If a sensing cycle is short, the sensor member 310 may acquire more process data during the same time, and if the sensing cycle is long, the sensor member 310 may acquire less process data during the same time.

The power source member 340 may transmit a power to the sensor member 310, the transmission member 320, and the reception member 330. The power source member 340 may be connected to the sensor member 310, the transmission member 320, and the reception member 330 through a power line. In contrast, the power source member 340 may transmit the power to the sensor member 310, the transmission member 320, and the reception member 330 in a wireless power transmission method. The power source member 340 may be a battery which may be charged through a power source unit 420 to be described later.

In addition, the reception member 330 and the transmission member 320 may exchange a data with the sensor station 400 described later in a wireless communication manner. In addition, the above-mentioned reception member 330 and the transmission member 320 may exchange a data with the server 500 described later in a wireless communication manner.

Figure 6:
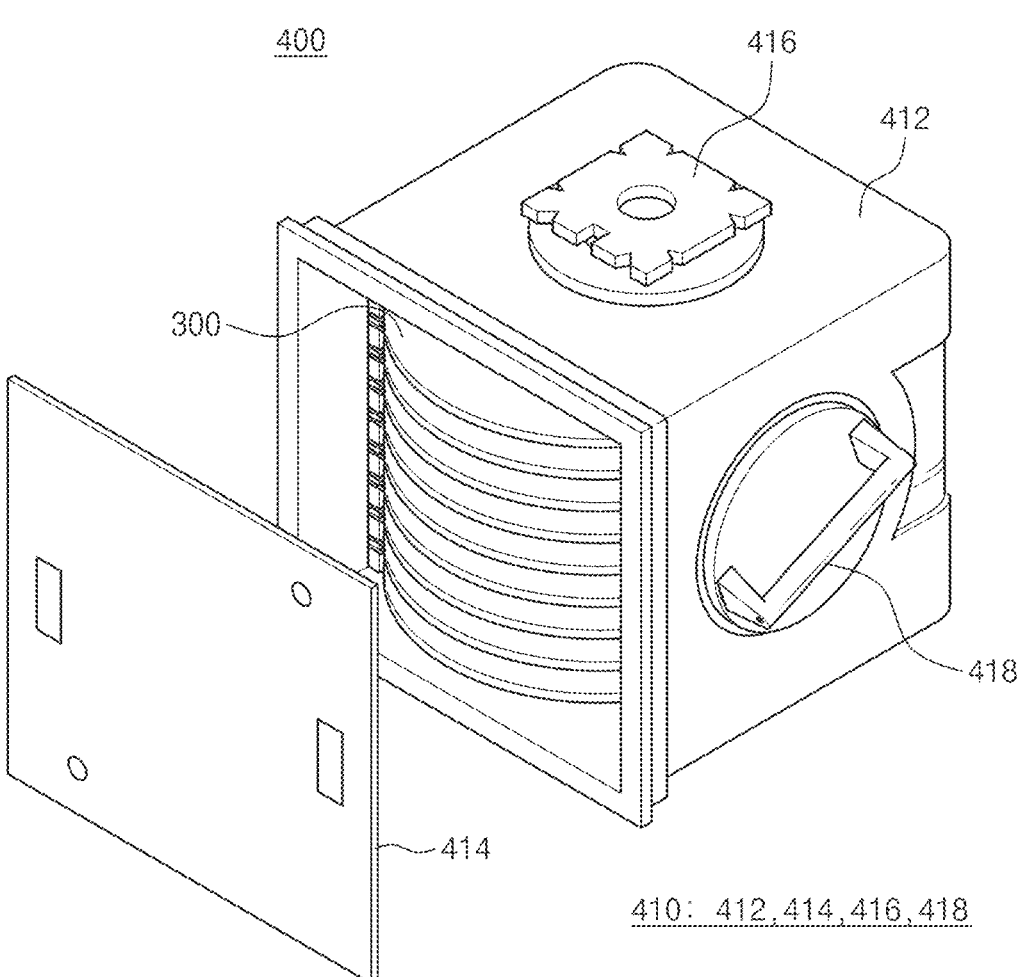
FIG. 6 illustrates a sensor station according to an embodiment of the inventive concept.
Figure 7:
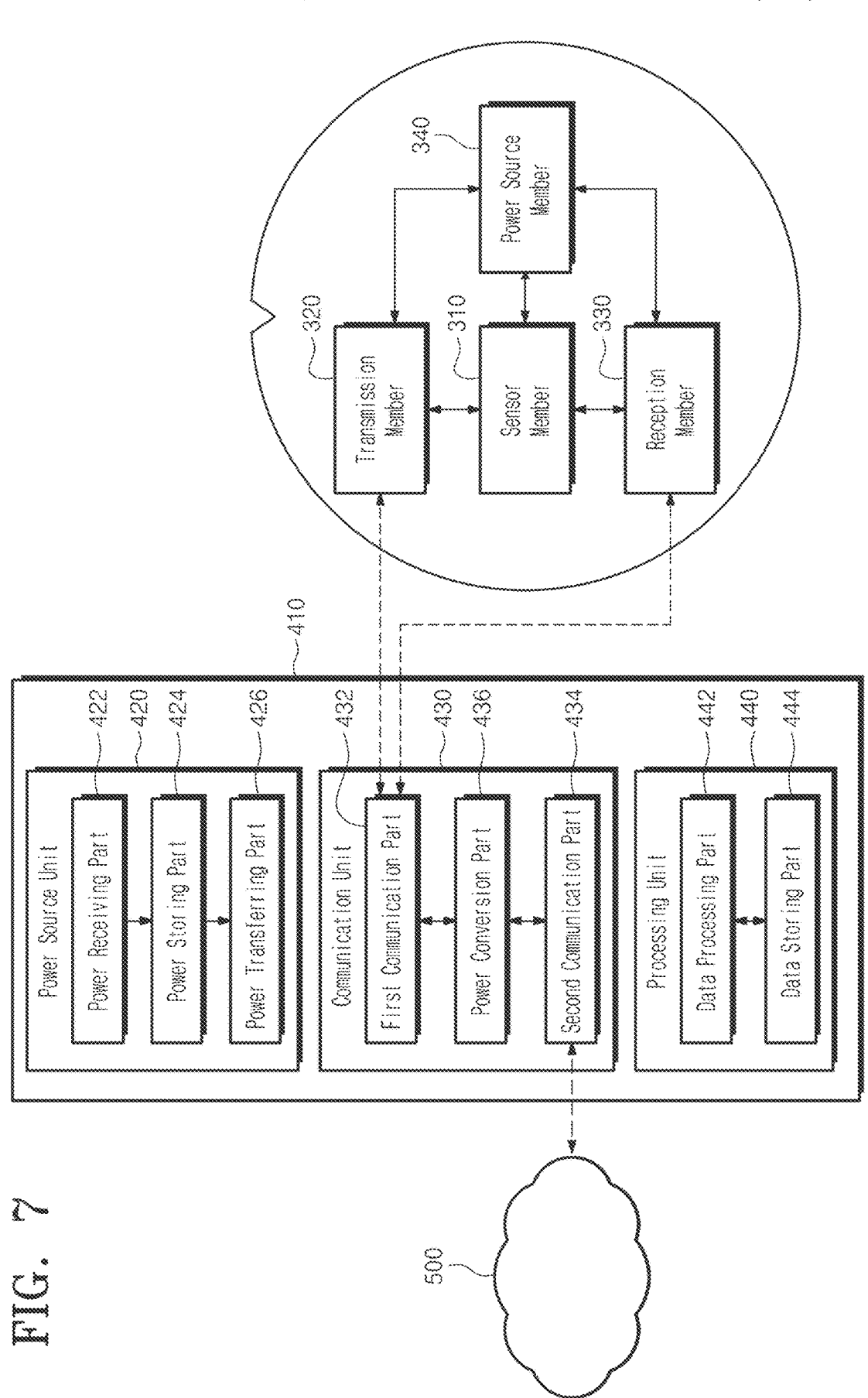
FIG. 7 is a block view schematically illustrating components of the sensor station of FIG. 6.

FIG. 6 illustrates the sensor station according to an embodiment of the inventive concept, and FIG. 7 is a block view schematically illustrating configurations of the sensor station of FIG. 6.

Referring to FIG. 6 and FIG. 7, the sensor station 400 according to an embodiment of the inventive concept may include a body 410, a power source unit 420, a communication unit 430, and a processing unit 440.

The body 410 may be a hardware forming an outer form of the sensor station 400. The body 410 may include a housing 412, a door 414, a flange 416, and a grip hand 418.

The housing 412 may have a shape having one surface which is open. The housing 412 may be combined with the door 414 to form an inner space in which the substrate-type sensor 300 may be stored. The door 414 may be automatically opened and closed by an opening/closing robot 124 to be described later. The flange 416 may be installed at a top portion of the housing 412. The flange 416 may be gripped by the gripper of the above-described transfer device 200. The grip hand 418 may be installed on a surface of the housing 412 aside from an open surface of the housing 412 and on a surface at which the flange 416 is installed. The grip hand 418 may be used if the operator directly carries the body 410.

The power source unit 420 may include a power receiving part 422, a power storing part 424, and a power transferring part 426. The power receiving part 422 may be a part which receives a power from an outer power source. The power receiving part 422 may be a portion physically coupled to a charging connector connected to the outer power source. In some cases, if the power is transferred by a wireless power transmission method (e.g., an electromagnetic induction method) of the outer power source, the power receiving part 422 may be a receiving coil which wirelessly receives the power. The power storing part 424 may perform a function of storing the power received by the power receiving part 422. The power storing part 424 may be a battery which stores the power. The power stored by the power storing part 424 may be transferred to the substrate-type sensor 300 stored in the inner space through the power transferring part 426. Specifically, the power transferring part 426 may charge the power source member 340 of the substrate-type sensor 300. The power transferring part 426 may transmit the power to the power source member 340 in a wired or wireless manner. In addition, the power transferring part 426 may transmit the power to the communication unit 430 and the processing unit 440. Accordingly, the communication unit 430 and the processing unit 440 may be driven.

The communication unit 430 may exchange a data with the substrate-type sensor 300 and/or the server 500. The data exchanged by the communication unit 430 with the substrate-type sensor 300 and/or the server 500 may be a process data sensed by the substrate-type sensor 300. The communication unit 430 may include a first communication part 432, a second communication part 434, and a communication conversion part 436.

The first communication part 432 may exchange a data with the substrate-type sensor 300. The first communication part 432 may be installed in the housing 412. The first communication part 432 may receive the process data from the transmission member 320 of the substrate-type sensor 300. In addition, the first communication part 432 may transmit a condition value for acquiring the process data at the reception member 330. The first communication part 432 may have the same communication method as the wireless communication method in which the substrate-type sensor 300 communicates. For example, if the transmission member 320 and/or the reception member 330 of the substrate-type sensor 300 uses a Zigbee communication method, the first communication part 432 may also use the Zigbee communication method. If the transmission member 320 and/or the reception member 330 of the substrate-type sensor 300 uses a Bluetooth communication method, the first communication part 432 may also use the Bluetooth communication method. If the transmission member 320 and/or the reception member 330 of the substrate-type sensor 300 uses a Wifi communication method, the first communication part 432 may also use the Wifi communication method. If the transmission member 320 and/or the reception member 330 of the substrate-type sensor 300 use a LAN communication method, the first communication part 432 may also use the LAN communication method.

The second communication part 434 may exchange a data with the server 500. The second communication part 434 may be installed outside of the housing 412. The data exchanged between the second communication part 434 and the server may be the process data acquired by the substrate-type sensor 300. In addition, the second communication part 434 may have the same communication method as the server 500. For example, the server 500 may have any one communication method of the Zigbee communication method, the Wifi communication method, the Bluetooth communication method, and the LAN communication method, and the second communication part 434 may have the same communication method as the server 500.

The communication conversion part 436 may mediate a communication between the substrate-type sensor 300 and the server 300 if the communication method of the substrate-type sensor 300 is different from the communication method of the server 500 (i.e., a case of a heterogeneous network). For example, if the substrate-type sensor 300 has the Zigbee communication method and the server 500 has the Wifi communication method, it may serve as a gateway to mediate a communication between the substrate-type sensor 300 and the server 500.

The processing unit 440 may process the process data transmitted by the substrate-type sensor 300. The processing unit 440 may store the process data transmitted by the substrate-type sensor 300. The processing unit 440 may include a data processing part 442 and a data storing part 444. The data processing part 442 may include a CPU and may derive a necessary data from the process data transmitted by the substrate-type sensor 300. For example, the data processing part 442 may perform a statistical processing such as an average and a variance of the process data. The data storing part 444 may include a nonvolatile memory, may store a pre-treatment data (i.e., a raw data not processed by the data processing part 442) transmitted by the substrate-type sensor 300, or store a data (i.e., a processed data derived by the data processing part 442) after the data is processed by the data processing part 442.

The server 500 may be a server for a process automation of the substrate treating system 10. The server 500 may include a CPU and a memory. The CPU may execute a process control program that may be stored in the memory. The server 500 may receive the process data from the sensor station 400 and/or the substrate-type sensor 300 in the wireless communication method. The server 500 may transmit a transmitted process data to the substrate treating apparatuses 100 in the wireless communication manner, and the substrate treating apparatus 100 may adjust treating conditions of the substrate treating apparatuses based on the transmitted process data.

Figure 8:
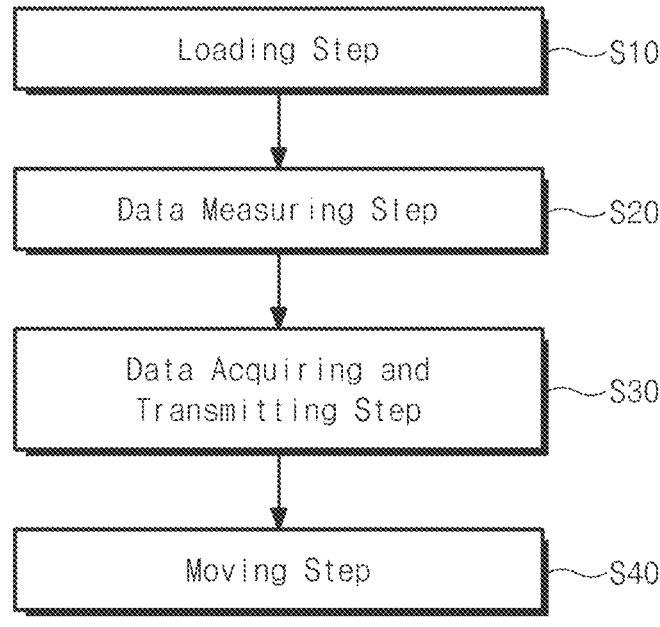
FIG. 8 is a flowchart illustrating a data acquisition method according to an embodiment of the inventive concept.

FIG. 8 is a flowchart illustrating a data acquisition method according to an embodiment of the inventive concept. Referring to FIG. 8, the data acquisition method according to an embodiment of the inventive concept may include a loading step S10, a data measuring step S20, a data acquiring and transmitting step S30, and a moving step S40.

The loading step S10 may be a step in which the substrate-type sensor 300 is stored in the sensor station 400, and the sensor station 400 in which the substrate-type sensor 300 is stored is loaded into the load port 110 by the transfer device 200.

If the loading step S10 is performed, the opening/closing robot 124 provided in the index chamber 120 may open the door 414 of the sensor station 400. After opening the door 414, transfer units of the substrate treating apparatus 100 can take out the substrate-type sensor 300 from the inner space of the sensor station 400 and return the substrate-type sensor to the process chamber 150.

In the data measuring step S20, the substrate-type sensor 300 taken into the process chamber 150 may measure the above-described process data. As described above, the process data may be various process data such as a temperature profile, a pressure profile, a voltage profile, a current profile, and a power profile.

In the data acquiring and transmitting step S30, at least some periods may overlap the data measuring step S20. For example, the data acquiring and transmitting step S30 may be performed almost simultaneously with the data measuring step S20. In the data acquiring and transmitting step S30, the substrate-type sensor 300 and the sensor station 400 placed in the load port 112 may wirelessly communicate with each other. In the data acquiring and transmitting step S30, the substrate-type sensor 300 and the sensor station 400 may wirelessly communicate with each other to transmit the process data measured by the substrate-type sensor 300 taken into the process chamber 150. The process data measured by the substrate-type sensor 300 may be transmitted to the sensor station 400 through the first communication part 432 of the sensor station 400.

Figure 9:
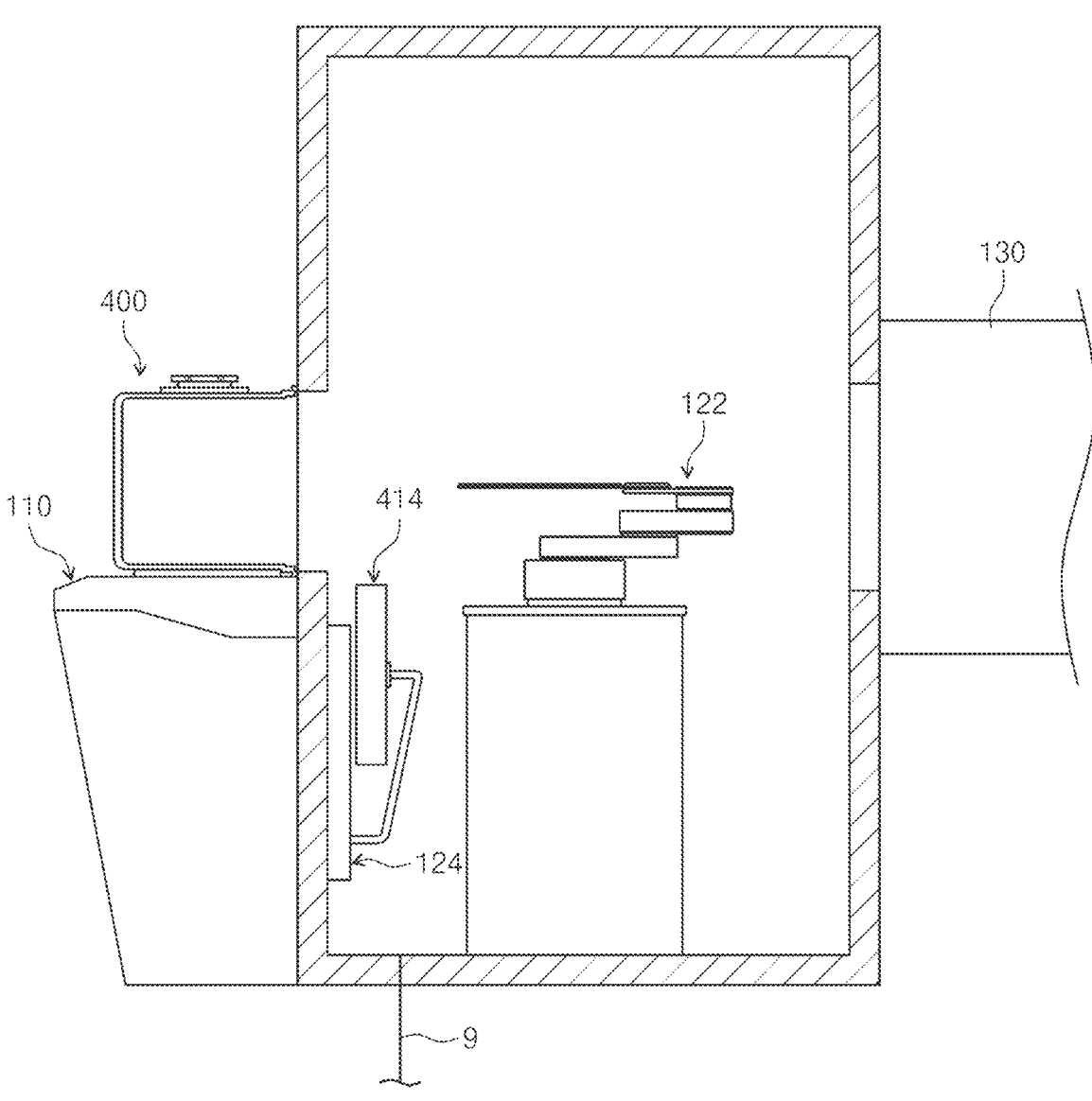
FIG. 9 illustrates a state in which a door of the sensor station is opened while a data acquiring and transmitting step of FIG. 8 is performed.

In the data acquiring and transmitting step S30, as illustrated in FIG. 9, the door 414 of the sensor station 400 may be performed in an open state. One of the reasons why it is difficult for the substrate-type sensor 300 to transmit the process data to the server 500 in real time through the wireless communication is that it senses the process data in the substrate treating apparatus 100, which is separated from an outer environment. Here, at the data acquiring and transmitting step S30, the sensor station 400 may be placed in the load port 112, and may easily wirelessly communicate with the first communication part 432 disposed in the housing 412 while the door 414 is open, thereby facilitating an exchanging the process data. In this case, this is because the first communication part 432 is disposed in the inner space of the substrate treating apparatus 100. That is, if a sensitivity of the communication unit 430 and the server 500 is greater than a set sensitivity, the transmission member 320 of the substrate-type sensor 300 may immediately transmit the process data to the server 500 via the communication unit 430.

Referring back to FIG. 8, the process data sensed by the substrate-type sensor 300 may be transmitted to the server 500 in the data acquiring and transmitting step S30. In the data acquiring and transmitting step S30, the process data measured in the data measuring step S20 may be transmitted to an outer server 500 by the wireless communication method. In this case, since the second communication part 434 is installed outside the housing 412, a wireless communication with the outer server 500 may be facilitated.

A sensitivity between the sensor station 400 and the server 500 may be somewhat low depending on a position of the sensor station 400. For example, if a sensitivity between the communication unit 430 and the server 500 is the same or less than a set sensitivity (i.e., if the sensor station 400 exists in a radio shadow area of the wireless network), the process data measured by the substrate-type sensor 300 is first stored in a non-volatile way in the data storing part 444, and then if the sensor station 400 deviates from the radio shadow area of the wireless network, the communication unit 430 may transmit the process data stored in the data storing part 444 to the server 500.

Conversely, the sensitivity between the sensor station 400 and the server 500 may be high depending on the position of the sensor station 400. For example, if the sensitivity between the communication unit 430 and the server 500 is greater than the set sensitivity (i.e., if the sensor station 400 exists outside the radio shadow area of the wireless network), the process data measured by the substrate-type sensor 300 may be transmitted directly to the server 500 via the communication unit 430 of the sensor station 400 in real time. In this case, the process data may be temporarily stored in the volatile memory which the processing unit may have and then transmitted to the server 500, or in some cases, the process data transmitted by the substrate-type sensor 300 may not be temporarily stored in the sensor station 400, but may be immediately transmitted to the server 500 and stored at the server 500.

If a process data acquisition for one substrate treating apparatus 100 is completed, the moving step S40 is performed. In the moving step S40, the substrate-type sensor 300 may be stored in the sensor station 400, and the sensor station 400 may be returned to another substrate treating apparatus 100. A transfer of the sensor station 400 may be performed by the transfer device 200.

As described above, the sensor station 400 of the inventive concept may be returned by the transfer device 200, thereby automating a process data acquisition. In addition, the sensor station 400 may provide a convenience in managing and storing the process data and may perform a gateway function which enables a communication between heterogeneous networks. In addition, the sensor station 400 may exchange the data with the server 500 or the substrate-type sensor 300 through the wireless communication, and may function as a satellite server and an edge computing device that can store the process data in a radio shadow area of the network. In addition, the sensor station 400 may exchange the data with each other in the wireless communication method through laptops or tablets as necessary. For example, an Adhoc network between the sensor station 400 and a tablet may be supported.

In addition, although the sensor station 400 has been described as an example of performing a function similar to that of the container F, a case may also be considered having the sensor station 400 fixedly installed to the sensor station 400. In this case, the sensor station 400 may be disposed in a path which may contact an arm of the index robot 122 or an arm of the transfer robot 142.

In addition, a vision member (another example of the data measurement member) for acquiring an image may be installed at the substrate-type sensor 300. That is, the substrate-type sensor 300 may be provided with a sensor member 310 which measures the process data and/or a data measurement member which measures a status data such as an environmental/facility status information in the process chamber 150.

In addition, in the above-described example, the sensor member 310 is a sensor such as a pressure measurement sensor, a temperature measurement sensor, a voltage measurement sensor, and a current measurement sensor, but is not limited thereto.

For example, the sensor member 310 may be an acceleration sensor or a rotation angle detection sensor such as a gyroscope sensor. A plurality of sensor members 310 may be provided, one of which may be an acceleration sensor and another of which may be a rotation angle detection sensor. In this case, the substrate-type sensor 300 may measure a data of a path of the arm of the transfer robot 142 and an inclination of the substrate-type sensor 300 if the transfer robot 142 returns the substrate-type sensor 300, and the measured data may be transmitted to the sensor station 400. In addition, if the substrate-type sensor 300 is provided with the acceleration sensor, the sensor station 400 may derive a profile on a transfer speed of the substrate-type sensor 300 when transferring the substrate-type sensor 300, and determine whether a derived profile matches a profile of the previously stored transfer speed. Accordingly, the transferring operation of the transfer robot 142 may be taught.

Also, the sensor member 310 may be a vibration sensor. If the sensor member 310 is a vibration sensor, a data on a vibration which may occur if the transfer robot 142 transfers the substrate-type sensor 300 may be measured.

In addition, in the above example, if the sensor member 310 is a temperature measurement sensor, it is taken into the process chamber 150 to measure a process temperature data in the process chamber 150, but the inventive concept is not limited thereto. For example, the sensor member 310 may measure a data on a temperature change of a space which may be transferred in the facility. For example, the sensor member 310 may measure a data on a temperature change of an inner environmental such as the load lock chamber 130 and the transfer chamber 140 while the substrate-type sensor 300 is being transferred.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A sensor station configured to be seated on a load port that is provided in a substrate treating apparatus, the sensor station comprising:

a body providing an inner space for storing a substrate-type sensor, the substrate-type sensor configured to be taken into a process chamber of the substrate treating apparatus and measure data;

a power source unit installed at the body, the power source unit configured to transmit a power to the substrate-type sensor;

a processing unit installed at the body, the processing unit configured to process the data measured by the substrate-type sensor; and a communication unit installed at the body, the communication unit configured to exchange the data with the substrate-type sensor and a server of a substrate treating system, the server being outside the substrate treating apparatus, wherein the body comprises a housing with one side open, and a door configured to define the inner space with the body, wherein, when the sensor station is seated on the load port and the door is opened by an opening/closing robot of the substrate treating apparatus, the communication unit is configured to collect the data transmitted by the substrate-type sensor taken into the process chamber and transmit the data to the server, wherein a first period, during which the substrate-type sensor measures the data within the process chamber, and a second period, during which the communication unit collects and transmits the data to the server, overlap at least partially, wherein the sensor station seated on the load port is exposed to an outside of the substrate treating apparatus, and wherein the sensor station with the door open is also exposed to an inside of the substrate treating apparatus.

2. The sensor station of claim 1, wherein the body further comprises a flange, the flange installed at the housing and configured to be gripped by a gripper of a transfer device.

3. The sensor station of claim 1, wherein the power source unit comprises:

a power receiving part configured to receive the power from an outer power source;

a power storing part configured to store the power received at the power receiving part; and a power transferring part configured to transmit the power of the power storing part to the substrate-type sensor stored at the inner space.

4. The sensor station of claim 1, wherein the communication unit comprises:

a first communication part configured to exchange the data with the substrate-type sensor; and a second communication part configured to exchange the data with the server of the substrate treating system.

5. The sensor station of claim 4, wherein the communication unit further comprises a communication conversion part configured to mediate a-communication between heterogeneous networks.

6. The sensor station of claim 1, wherein the processing unit comprises:

a data processing part configured to process the data transmitted by the substrate-type sensor to generate post-treatment data; and a data storing part configured to store the post-treatment data generated by the data processing part and the data transmitted by the substrate-type sensor through the communication unit.

7. A substrate treating system comprising:

a substrate treating apparatus configured to treat a substrate, the substrate treating apparatus including a load port for placing a container storing the substrate, a process chamber configured to treat the substrate, and a transfer unit configured to transfer the substrate between the container and the process chamber;

a substrate-type sensor configured to measure data at the process chamber, the substrate-type sensor including a body configured to be transferred to the process chamber by the transfer unit, a data measurement member installed at the body and configured to measure the data, and a transfer member and a power source member installed at the body and configured to transmit the data measured by the data measurement member;

a server outside the substrate treating apparatus; and a sensor station configured to be seated on the load port, wherein the sensor station comprises a housing with one side open, a door configured to define an inner space by being coupled with the housing, a flange installed at the housing, the flange configured to be gripped by a gripper of a transfer device, and a communication unit installed at the body, the communication unit configured to exchange data with the substrate-type sensor and the server, wherein the substrate treating apparatus further comprises an opening/closing robot, the opening/closing robot being configured to open or close the door of the sensor station placed on the load port, wherein the opening/closing robot is configured to open the door of the sensor station placed on the load port while the substrate-type sensor measures the data at the process chamber, wherein, when the sensor station is seated on the load port and the door is opened, the communication unit is configured to collect the data transmitted by the substrate-type sensor taken into the process chamber and transmit the data to the server, wherein a first period, in which the substrate-type sensor measures the data within the process chamber, and a second period, during which the communication unit collects the data and transmits the data to the server, overlap at least partially, wherein the sensor station seated on the load port is exposed to an outside of the substrate treating apparatus, and wherein the sensor station with the door open is also exposed to an inside of the substrate treating apparatus.

8. The substrate treating system of claim 7, wherein the sensor station further comprises:

a power source unit installed at the body and configured to transfer a power to the power source member; and a processing unit installed at the body and configured to process the data measured at the data measurement member.

9. The substrate treating system of claim 8, wherein the power source unit comprises:

a power receiving part configured to receive the power from an outer power source;

a power storing part configured to store the power received at the power receiving part; and a power transferring part configured to transfer the power of the power storing part to the substrate-type sensor stored at the inner space.

10. The substrate treating system of claim 7, wherein the communication unit further comprises communication conversion part configured to mediate a communication between heterogeneous networks.

11. The substrate treating system of claim 7, wherein the processing unit comprises:

a data processing part configured to process the data transferred by the substrate-type sensor to generate post-treatment data; and a data storing part configured to store the post-treatment data generated by the data processing part or the data transferred through the communication unit by the substrate-type sensor.

12. The substrate treating system of claim 7, wherein the transfer device is configured to transfer the sensor station and the container.

* * * * *